(12) United States Patent
Kapila et al.

(10) Patent No.: US 9,110,111 B1
(45) Date of Patent: Aug. 18, 2015

(54) METHODS AND SYSTEMS TO DETERMINE A FINAL VALUE OF RANDOM TELEGRAPH NOISE TIME CONSTANT AND MAGNITUDE

(71) Applicant: Texas Instruments Incorporated, Dallas, TX (US)

(72) Inventors: Gautam Kapila, Richardson, TX (US); Vijay Kumar Reddy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/250,867

(22) Filed: Apr. 11, 2014

Related U.S. Application Data (60) Provisional application No. 61/816,502, filed on Apr. 26, 2013.

(51) Int. Cl.
*H01L 29/10* (2006.01)
*G01R 23/16* (2006.01)
*G01R 29/26* (2006.01)

(52) U.S. Cl.
CPC ............... *G01R 23/16* (2013.01); *G01R 29/26* (2013.01)

(58) Field of Classification Search
None
See application file for complete search history.

(56) References Cited

U.S. PATENT DOCUMENTS 8,155,905 B2   4/2012  Miki
2012/0065920 A1   3/2012  Nagumo et al.

OTHER PUBLICATIONS

Gautam Kaplia et al.; Impact of Sampling Rate in RTN Time Constant Extraction and its Implications on Bias Dependency and Trap Spectroscopy; 2014 IEEE; DOI10.1109/TDMR.2014.2305972. 1530-4388; 7 pgs.

*Primary Examiner* — Yasser A Abdelaziez
(74) *Attorney, Agent, or Firm* — Steven A. Shaw; Frank D. Cimino (57) ABSTRACT

A method includes, for a device and at each of a plurality of sampling frequencies, measuring a parameter of the device to generate a plurality of signals and each signal represents a time series of values of the parameter. Further, the method includes for each of the plurality of signals, identifying at least two stable states in the time series for each signal. Still further, the method includes determining a time constant associated with each stable state of each signal, determining a relationship between the time constants of each stable state and sampling frequency, and computing a final time constant value for each steady state by computing a derivative of the time constants as a function of sampling frequency relationship and comparing the derivative to a threshold.

19 Claims, 7 Drawing Sheets

METHODS AND SYSTEMS TO DETERMINE A FINAL VALUE OF RANDOM TELEGRAPH NOISE TIME CONSTANT AND MAGNITUDE

CROSS-REFERENCE TO RELATED APPLICATION

This application claims the benefit of priority to U.S. Provisional Application 61/816,502 filed Apr. 26, 2013 and incorporated herein by reference.

BACKGROUND

Random telegraph noise (RTN) is considered as time domain representation of a Lorentzian spectrum, summation of multitude of which with different characteristic frequencies is called flicker (1/f) noise. The RTN is commonly observed in electronic devices, especially semiconductor devices. Generally, RTN in a device is associated mobile carriers being trapped and released from a trap that exists in the device. The RTN may have an impact to deviate from the device's originally desirable performance.

SUMMARY

Methods and systems to determine a final value of random telegraph noise (RTN) time constant and RTN magnitude are disclosed herein. In an embodiment, a method includes, for a device and at each of a plurality of sampling frequencies, measuring a parameter of the device to generate a plurality of signals and each signal represents a time series of values of the parameter. Further, the method includes for each of the plurality of signals, identifying at least two stable states in the time series for each signal. Still further, the method includes determining a time constant associated with each stable state of each signal, determining a relationship between the time constants of each stable state and sampling frequency, and computing a final time constant value for each steady state by computing a derivative of the time constants as a function of sampling frequency relationship and comparing the derivative to a threshold.

In an another embodiment, a method includes measuring a drain current of a semiconductor device over time, at a condition, by using one of a plurality of sampling frequencies and a first integration time, to generate a plurality of signals wherein each signals represents a time series of the drain current. The method further includes identifying a first time constant and a second time constant from the each of the plurality of measured signals, wherein the first time constant and the second time constant are associated with a first stable state and a second stable state for each of the plurality of measured signal respectively. Still further, the method includes determining a relationship between the first and second time constants, and sampling frequencies, and determining a final value for each of the time constants by computing a derivative of the time constants as a function of sampling frequency relationship and comparing the derivative to a threshold.

Still in a further embodiment, a system includes an analyzer to measure a parameter of a device to generate a plurality of signals wherein each signal represents a time series of values of the parameter and a computing resource coupled to the analyzer. More specifically, the computing resource includes a processor configured to execute a plurality of modules to, for the device at each of a plurality of sampling frequencies, cause the analyzer to apply a condition on the device to be measured and generate a plurality of signals over time using a first integration time, and each signals represents a time series of values of the parameter. Further, the processor executes the modules to identify at least two stable states in the time series for each signal, determine a time constant associated with each stable state of each signal, determine a relationship between the time constants of each stable state and sampling frequency, and to compute a final time constant value for each steady state by computing a derivative of the time constants as a function of sampling frequency relationship and comparing the derivative to a threshold.

BRIEF DESCRIPTION OF THE DRAWINGS

For a detailed description of exemplary embodiments of the invention, reference will now be made to the accompanying drawings in which.

NOTATION AND NOMENCLATURE

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Random Telegraph Noise (RTN) is a time domain representation of parameter fluctuations observed in electronic or optical devices. Generally, the RTN includes various sudden step-like transitions between two or more discrete levels of a parameter of the semiconductor devices, such as current, voltage, and so on. Typically, each of the parameter transitions (referred to as "offsets") in this disclosure may last from several milliseconds to tens of seconds. RTN is commonly considered to be associated with a defect existent in the semiconductor devices. RTN can be measured as described herein.

As a technology node continues to shrink (e.g., from nanoscale to deep-nanoscale semiconductor devices) while still following Moore's law, it may be useful to quantitatively understand various characteristics of the RTN. If a quantitative number for the RTN characteristic in a semiconductor device is available, the device may be more accurately modeled for various uses such as circuit analysis or simulation. In an example, a current source, based on the RTN characteristics, may be provided in a static random-access memory (SRAM) circuit to further explore the SRAM circuit performance under an influence of the RTN. Details of the RTN characteristics will be provided below.

As described above, the RTN includes the parameter offset which may last for a period of time. In general, the offset is referred to as RTN magnitude and the corresponding period of time is referred to as RTN time constants. For example, for the RTN for a metal oxide semiconductor field-effect transistor (MOSFET) to be measured, two discrete levels may exist in the measured current (e.g., drain current) over a period of time. A difference, or offset, between the two discrete levels of the drain current is the RTN magnitude. Each of the two levels may last an associated period of time, and each of the associated periods of time is the RTN time constant. More particularly, one is frequently referred to as an emission time constant and the other is a capture time constant. Details of the emission time constant and the capture time constant are described below.

Embodiments of the disclosed invention provide systems and methods to accurately extract the RTN time constants and the RTN magnitudes from measured time-varying parameters, such as current or voltage (e.g., threshold voltage), of a semiconductor device by choosing a suitable sampling frequency and average time. More particularly, the disclosed systems and methods may be generalized to extract more than two parameter levels. As such, the disclosed systems and methods may advantageously provide a more efficient way to model a characteristic of a semiconductor device in order to utilize the semiconductor device for any suitable applications. Although the disclosed technique can be implemented to extract N parameter levels (N greater than or equal to 2), for a purpose of clear illustration, two levels will be discussed hereinafter.

Figure 1:
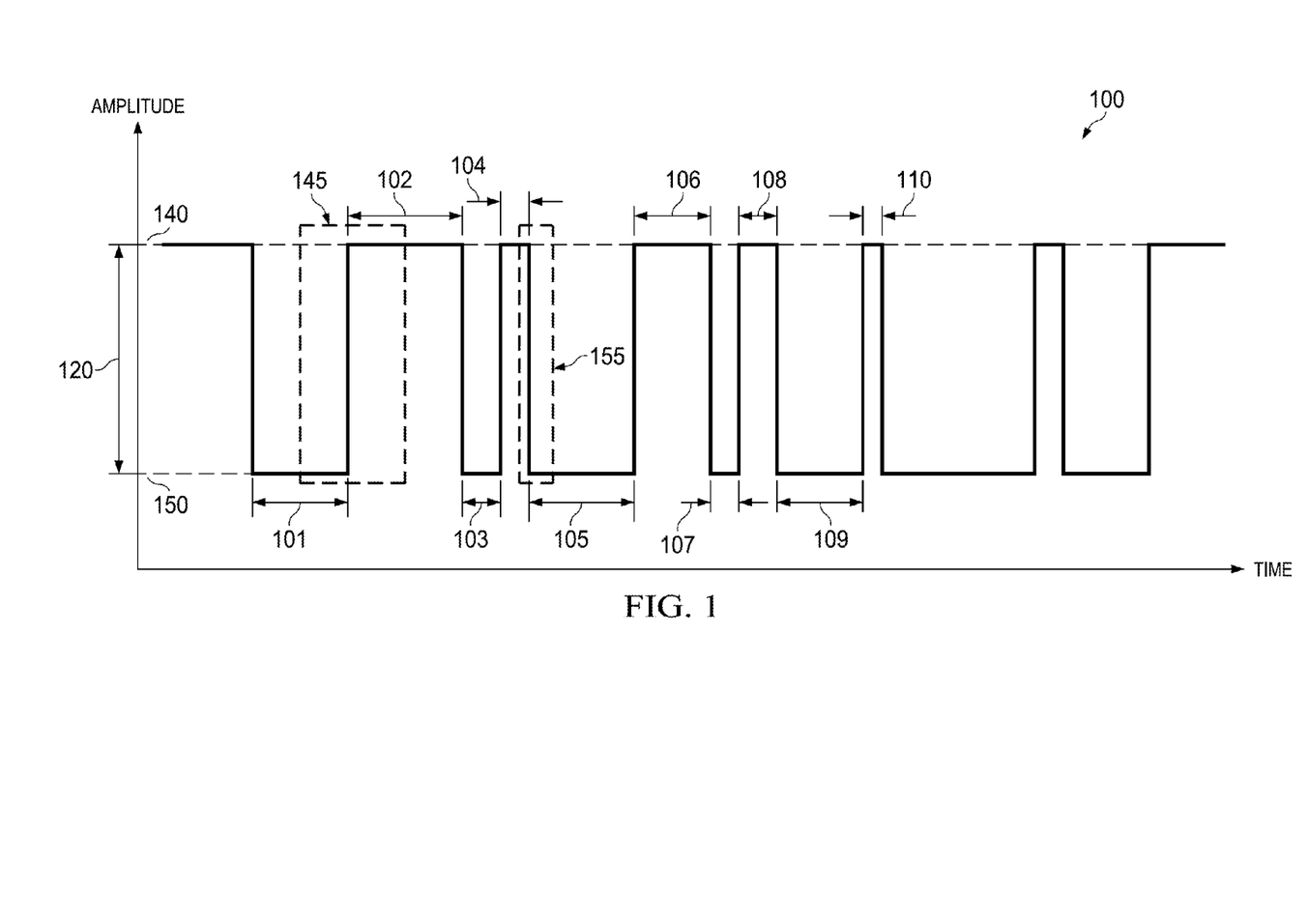
FIG. 1 shows an example of a signal including random telegraph noise (RTN) in accordance with various embodiments.

FIG. 1 shows an illustrated example of the RTN present in a measured signal 100 in accordance with various embodiments. The signal 100 is a waveform of a parameter over time and includes a time series of values of the parameter. This means that at each point in time, there is a corresponding value for the parameter (i.e., amplitude shown on y-axis of FIG. 1). For example, if the signal 100 is a measured drain current over time of a MOSFET, the amplitude is the time-varying drain current. As shown in FIG. 1, the signal 100 includes a plurality of step-like transitions (e.g., 145 and 155) between two stable states, or levels of the amplitude 140 and 150. A change 120 between the two levels may be referred to as the RTN magnitude. Further, the signal 100 maintains itself at each of the levels 140 and 150 for a period of time (e.g., 101, 102, 103, 104, 105, 106, 107, 108, 109 and 110). Each of the periods of time may be referred to as the RTN time constant.

In accordance with the preferred embodiments, the RTN time constant and the RTN magnitude are determined to fully characterize the RTN.

For a signal (e.g., 100) including a two-level RTN as shown in the example of FIG. 1, the transition from a lower level to a higher level (e.g., transition 145) is generally referred to as "emission", and the transition from a higher level to a lower level (e.g., transition 155) is referred to as "capture". The term of capture and emission generally refer to a carrier being captured at, or emitted from, a trap, or a defect, near a silicon-insulator interface. The capture and emission processes cause such bi-stable alternation of the drain current of the MOSFET. Generally, in a preferred embodiment, the period of time (e.g., 101, 103, 105, 107 and 109) that the signal 100 holds at the lower level 150 is referred to as "emission time constant", and the period of time (e.g., 102, 104, 106, 108 and 110) at the higher level 140 is referred to as "capture time constant".

As mentioned above, a signal including the RTN may include more than two levels, which will result in more than two RTN time constants. For example, for a measured signal including four levels, there may be four distinct RTN time constants associated with each of the four levels, and all such time constants are determined. Further, the disclosed techniques for assessing the RTN are not limited to extracting the RTN time constants from the drain current of the MOSFET. The embodiments may be generalized to extract the RTN time constants from any types of time-varying signals of any type of semiconductor devices, electronic devices, optical devices, or magnetic devices, for example, a time-varying threshold voltage of a metal insulator semiconductor field effect transistor (MISFET), a time-varying terminal current of a bipolar junction transistor (BJT), heterojunction bipolar transistor (HBT), high electron mobility transistor (HEMT), a time-varying resistance value of a copper nano-bridge, a time-varying magnetization value of a spin-valve nanopillar device, and so on. For ease to explain how the disclosed embodiments are implemented to extract the RTN time constants and the RTN magnitudes (i.e., RTN characteristics), only two levels of the RTN in the drain current of a MOSFET (i.e., semiconductor device) will be used in the following discussion.

Figure 2:
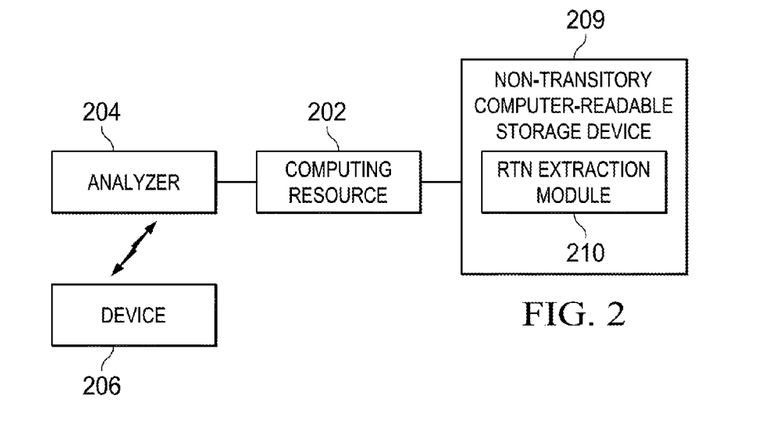
FIG. 2 shows a block diagram of a system to extract random telegraph noise (RTN) in accordance with various embodiments.

FIG. 2 shows a block diagram of a system 200 implemented to extract the RTN characteristics, if existent, from a device 206 in accordance with various embodiments. The system 200 includes a computing resource 202 coupled to an analyzer 204 and a non-transitory, computer-readable storage device 209. The non-transitory, computer-readable storage device 209 includes a RTN extraction module 210. In some embodiments, the non-transitory, computer-readable storage device 209 may be implemented as volatile storage (e.g., random access memory), non-volatile storage (e.g., hard disk drive, optical storage, solid-state storage, etc.) or combinations of various types of volatile and/or non-volatile storage. The computing resource 202 is a hardware device an may include one or more processors, one or more computers, or any other type of computing resource to execute the RTN extraction module 210. As a result of executing the RTN extraction module 210, the computing resource 202 may provide the analyzer 204 suitable parameters to be used to measure a signal from the device 206. The analyzer 204 is to measure a time-varying signal of the device 206, such as a time-varying voltage, a time-varying current, etc. Even though the system 200 as shown in FIG. 2 includes the computing resource 202, the storage device 209 and the analyzer 204 as distinct components, in other embodiments, the computing resource 202, the storage device 209 and the analyzer 204 may be part of the same component.

Figure 3:
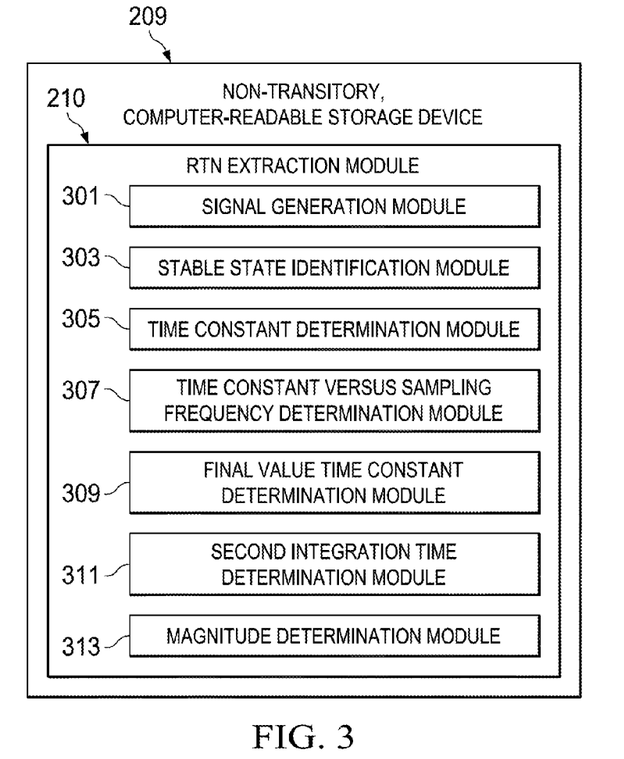
FIG. 3 shows an example of detailed random telegraph noise (RTN) extraction module in accordance with various embodiments.

FIG. 3 shows a block diagram to further illustrate an implementation of the non-transitory, computer-readable storage device 209 in accordance with various embodiments. The storage device 209 includes the RTN extraction module 210, wherein the RTN extraction module 210 includes a variety of modules that can be executed by the computing resource 202 to perform any or all of the functionality described herein.

As shown in the example of FIG. 3, the RTN extraction module 210 includes seven modules which may include: signal generation module 301, stable state identification module 303, time constant determination 305, time constant versus sampling determination module 307, final value of time constant determination module 309, second integration time determination module 311, and magnitude determination module 313. Each module of FIG. 3 may be executed by the computing resource 202 to implement the functionality described herein. The functions to be implemented by executing the modules 301, 303, 305, 307, 309, 311, and 313 will be described with reference to the flow diagram of FIG. 5.

FIGS. 4a-4f illustrate a preferred technique for extraction of the RTN time constants from a measured signal 402. Referring briefly FIG. 1, for the signal 100 including two levels (e.g., 140 and 150), each level may include different values of RTN time constants. That is, the values of RTN time constants are formed as a distribution. For example, the level 140 includes 5 values of RTN time constants (i.e., 102, 104, 106, 108, and 110), and the level 150 includes 5 values of RTN time constants (i.e., 101, 103, 105, 107, and 109). To extract a single value of the RTN time constant for each level of a measured signal, a preferred implementation is explained below.

Figure 4A:
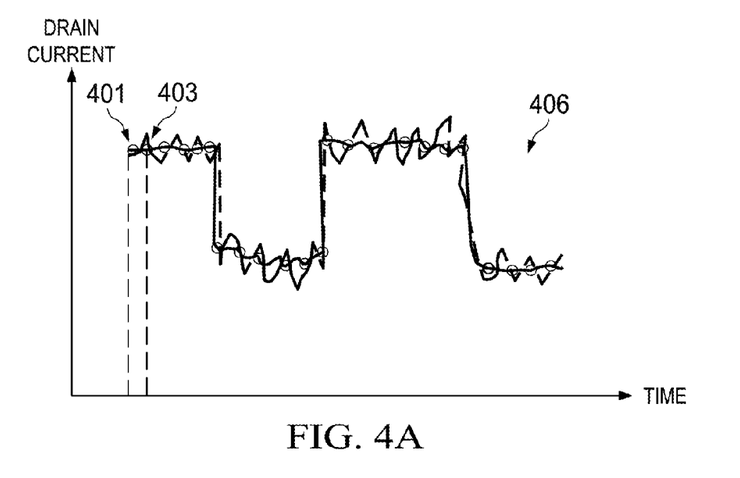
FIG. 4a-4f shows an example to extract a random telegraph noise (RTN) constant in accordance with various embodiments.

FIG. 4a shows the measured signal 402, wherein the signal 402 is a time series of a MOSFET's drain current values. More particularly, the y-axis of FIG. 4a represents the drain current and the x-axis represents the corresponding time. Signal 402 is measured under a single bias voltage and at a particular value of temperature that is applied to the MOSFET, a single sampling frequency, and a fixed average time. The bias voltage may refer to as a voltage applied between any two terminals of the MOSFET. The sampling frequency is defined as an inverse of a sampling time period, wherein the sampling time period is a time interval between two successive measured time points (e.g., 401 and 403). Further, the average time is also referred to as an integration time: the integration time is a time period used to average the corresponding signals (e.g., drain current) between two successive time points. Generally, the integration time is not greater than the sampling time period.

Figure 4B:
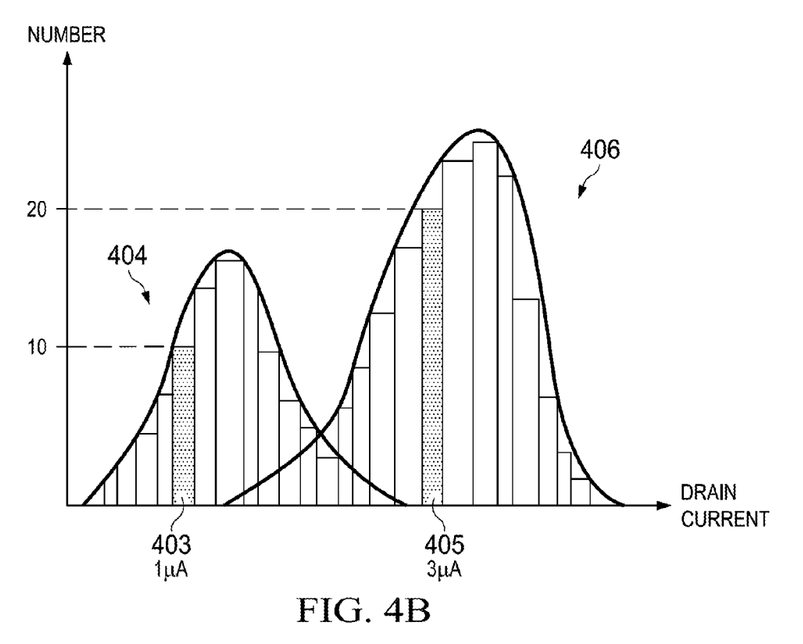

FIG. 4b shows two histograms 404 and 406 for the drain current of the signal 402. Each of the histograms represents a distribution, or a statistic, of the number of points (e.g., 401 and 403) for each corresponding drain current. As shown in FIG. 4b, two histograms have been estimated from the signal 402, which means that the signal 402 (e.g., drain current) may include a two-level RTN. In some preferred embodiment, each rectangle (e.g., 403 and 405) in the histograms may be associated with one value of drain current and a corresponding number of points. For example, as shown in FIG. 4b, the rectangle 403 of the histogram 404 indicates that, for the signal 402 being measured at 1 micro amp, there are 10 points existent in the signal 402. Similarly, the rectangle 405 of the histogram 406 represents that there are 20 points existent for a drain current of 3 micro amp in the signal 402.

Figure 4C:
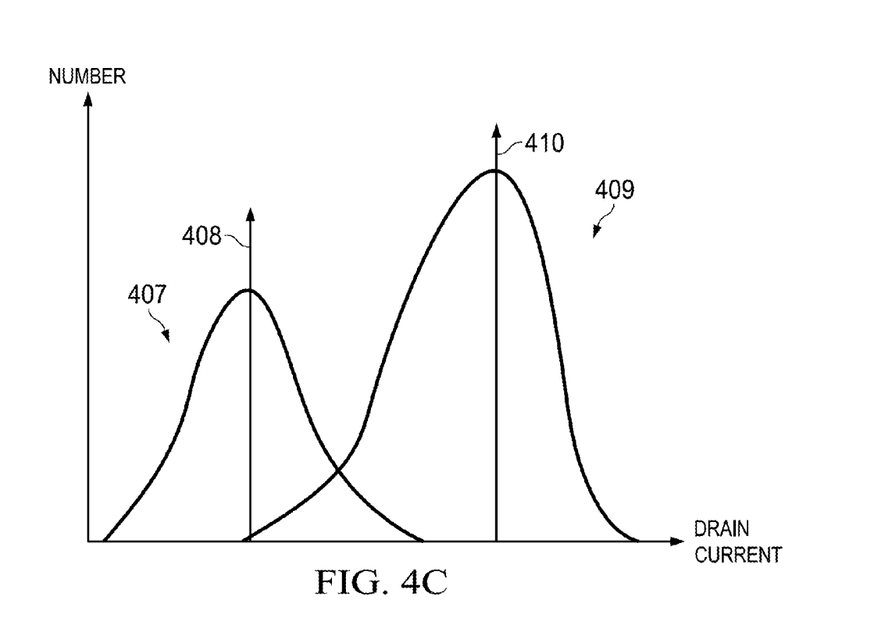

FIG. 4c shows two curves 407 and 409 to fit the histograms 404 and 406 respectively by using the "Gaussian mixture model." In some preferred embodiments, each of the curves 407 and 409 may include a normal distribution, and each of the normal distribution includes a mean value (e.g., mean 408 for curve 407 and mean 410 for curve 409). Each of mean values 408 and 410 may be used as a drain current threshold for subsequent extraction of the RTN time constants. Implementing these mean values as the drain current threshold is shown in FIG. 4d.

Figure 4D:
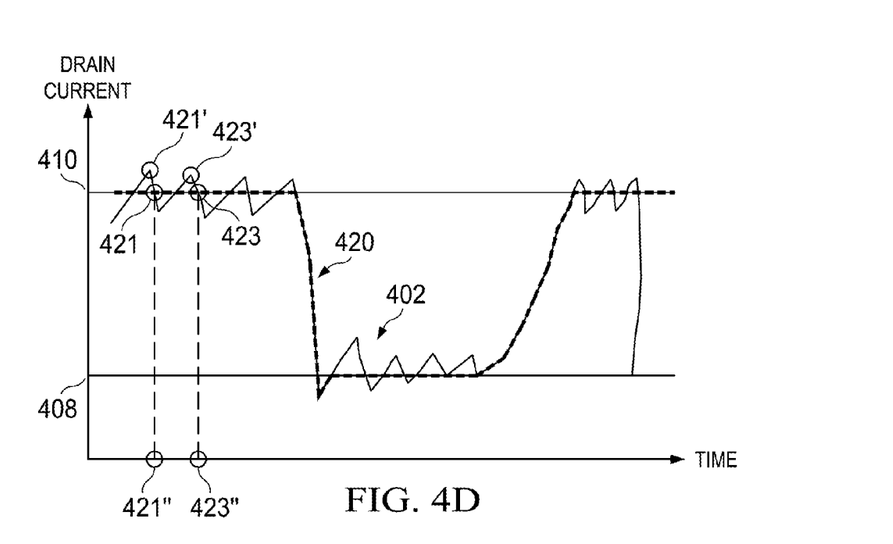

In FIG. 4d, the originally measured signal 402 is reconstructed by using the two mean values as thresholds. More specifically, the signal 402 may include some drain current points fluctuating above or below the threshold. A signal 420 is reconstructed by taking the values of the fluctuating points to be equivalent to the thresholds and reassigning corresponding time points, based on a metric, not limited to, midpoint between the thresholds. For example, drain current values of the original signal 402 at 421' and 423 may be several nano amperes larger than the threshold 410. After reconstructing the signal 420, those two values are taken as the value equivalent to the threshold 410, and cross-sectional values (e.g., 421 and 423) of the threshold 410 and the signal 402 may be associated with the reassigned time points (421" and 423"). More specifically, corresponding x-axis values for the cross-sectional values may be referred to as the reassigned time points. As such, the reconstructed signal 420 includes only two distinct drain current values (e.g., 408 and 410), and each drain current values include a plurality of reassigned time points (e.g., 421" and 423").

Figure 4E:
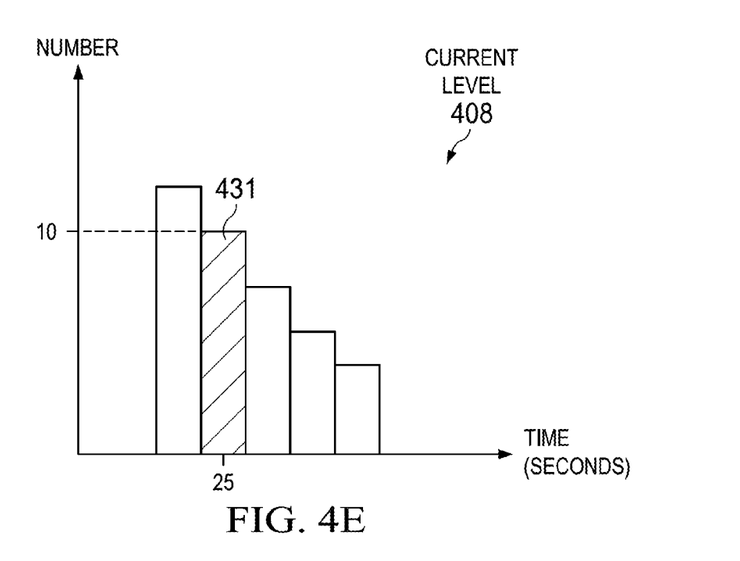
Figure 4F:
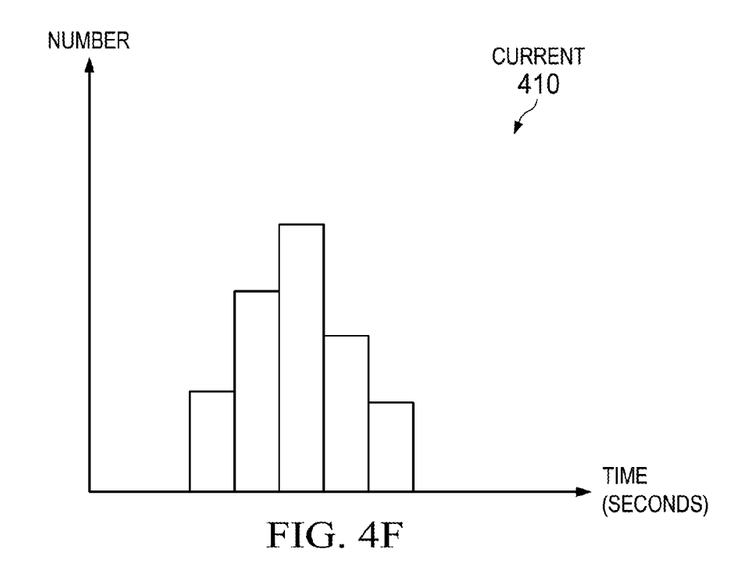

FIGS. 4e and 4f show two histograms for each of the thresholds (e.g., 408 and 410). Each of the histograms represents a distribution of the reassigned time points and includes a plurality of rectangles (e.g., 431). Each of the rectangles indicates the number of points for each corresponding reassigned time points. In a preferred embodiment, a time period between two successive reassigned time points for a threshold (e.g., 408 and 410) may be referred to as reconstructed RTN time constants for the threshold, or level. For example, the rectangle 431 is indicative of that, at drain current 408, there are totally 10 time periods that last for 2 seconds (i.e., reconstructed RTN time constants). Generally, with respect to the description in FIG. 1, the RTN time constant associated with the lower level (e.g., 408) at a two-level RTN is referred to as the emission time constant, and the RTN time constant associated with the higher level (e.g., 410) is referred to as the capture time constant. Thus, in a preferred embodiment, FIG. 4e may be a distribution for the capture time constant and FIG. 4f may be a distribution for the capture time constant.

Referring still to FIGS. 4e and 4f, each of the histograms includes a mean value of the RTN time constants. In a preferred embodiment, the mean value in FIG. 4e is used as an extracted emission time constant for the signal 402 measured at the bias voltage and at the particular temperature, sampling frequency and average time and, analogously, the mean value in FIG. 4f is used as an extracted capture time constant.

So far, a signal (e. g., 100 and 402) being used to extract the RTN time constants is measured by the analyzer 204 using a single sampling frequency. As discussed above, the RTN time constants for each level may be randomly distributed, so that a single sampling frequency may lead to an undesirable amount of overestimation of a final (i.e., true) value of the RTN time constant. Thus, the disclosed embodiments provide methods and systems to extract, from a variety of signals being measured under a variety of sampling frequencies, the final values of the RTN time constants for a device being applied on a single condition, such as bias voltage or a particular value of temperature. By repeating the disclosed method via applying at least one additional bias condition, in a preferred embodiment, a table including a final value for each RTN time constant associated with one particular condition may be generated. Further, based on the extracted final values of the RTN time constants, a single sampling frequency can be determined to extract the corresponding RTN magnitude (e.g., 120) between any two of the levels (e.g., 140 and 150) at the associated condition. Analogously, a table including a value for each RTN magnitude associated with one particular condition may be generated.

Figure 5:
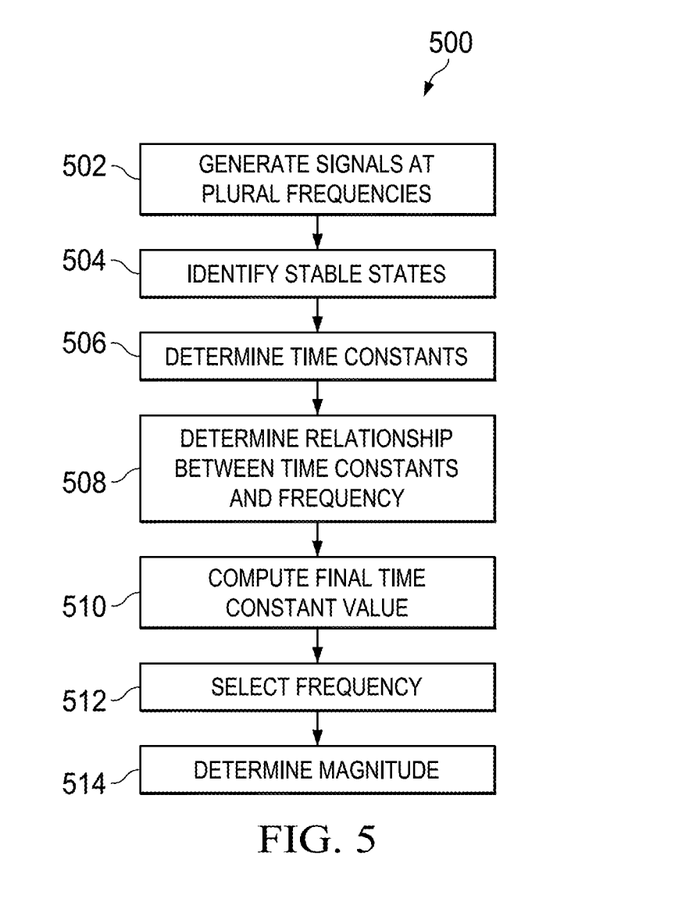
FIG. 5 shows a flow diagram to determine a final value of a random telegraph noise (RTN) constant and RTN magnitude in accordance with various embodiments.

FIG. 5 shows a flow diagram 500 to extract a final value of the RTN time constants and the RTN magnitude in accordance with various embodiments. As a result of executing the signal generation module 301 by the computing resource 202, the flow diagram 500 starts with block 502 to cause the analyzer 204 to start measuring a time-varying parameter (e.g., current, voltage, threshold voltage) of the device 206 at a single bias condition and using a first integration time, and generate a signal, wherein the signal represents a time series of values of the parameter. The measurement is repeated for multiple sampling frequencies by executing the signal generation module 301 so as to generate a multiple signals for analysis. In a preferred embodiment, values of the various sampling frequencies may be determined by the computing resource 202 via executing the signal generation module 301.

The computing resource 202 executes the stable state identification module 303 so that the flow diagram 500 continues with block 504 to identify how many stable states, or levels, existent in the various signals generated at block 502. After a number of levels has been determined at block 504, the flow diagram continues at block 506 to determine a value for each of the RTN time constants by executing the time constant determination module 305. In a preferred embodiment, the determination of the number of levels and the associated RTN time constant for each level may be performed as described above with respect to FIGS. 4*a*-4*f*. At block 506, the computing resource 202 may have data including various values of extracted RTN time constants, and each extracted RTN time constant is associated with one of the sampling frequencies. For example, if there are two levels which have been determined by the computing resource 202 and six sampling frequencies have been used to measure the signals, the data may include a 2×6 array, wherein a first column is associated with all the extracted RTN time constants for a first level, and a second column is associated with all the extracted RTN time constants for a first level. Each of the columns includes six values, and each value corresponds to a value of the extracted RTN time constants at one of the six sampling frequencies.

Referring still to the flow diagram 500, the computing resource 202 executes the time constant versus sampling frequency determination module 307 to perform the operation described in block 508 which is to determine a relationship between the extracted RTN time constants and sampling frequency. For a purpose of clear illustration, a graph (e.g., 600) indicating the relationship between the extracted RTN time constants and the sampling frequency for each level is provided in FIG. 6. Continuing with block 510, after the relationship is determined, the computing resource 202 executes the final value time constant determination module 309 to compute the final values for the RTN time constants. At block 510, the computing resource 202 may compute the final values for the RTN time constants based on the relationship between the extracted RTN time constants and sampling frequency. Before the explanation of the flow diagram 500 proceeds, a detailed explanation of the graph 600 will now be provided.

Figure 6:
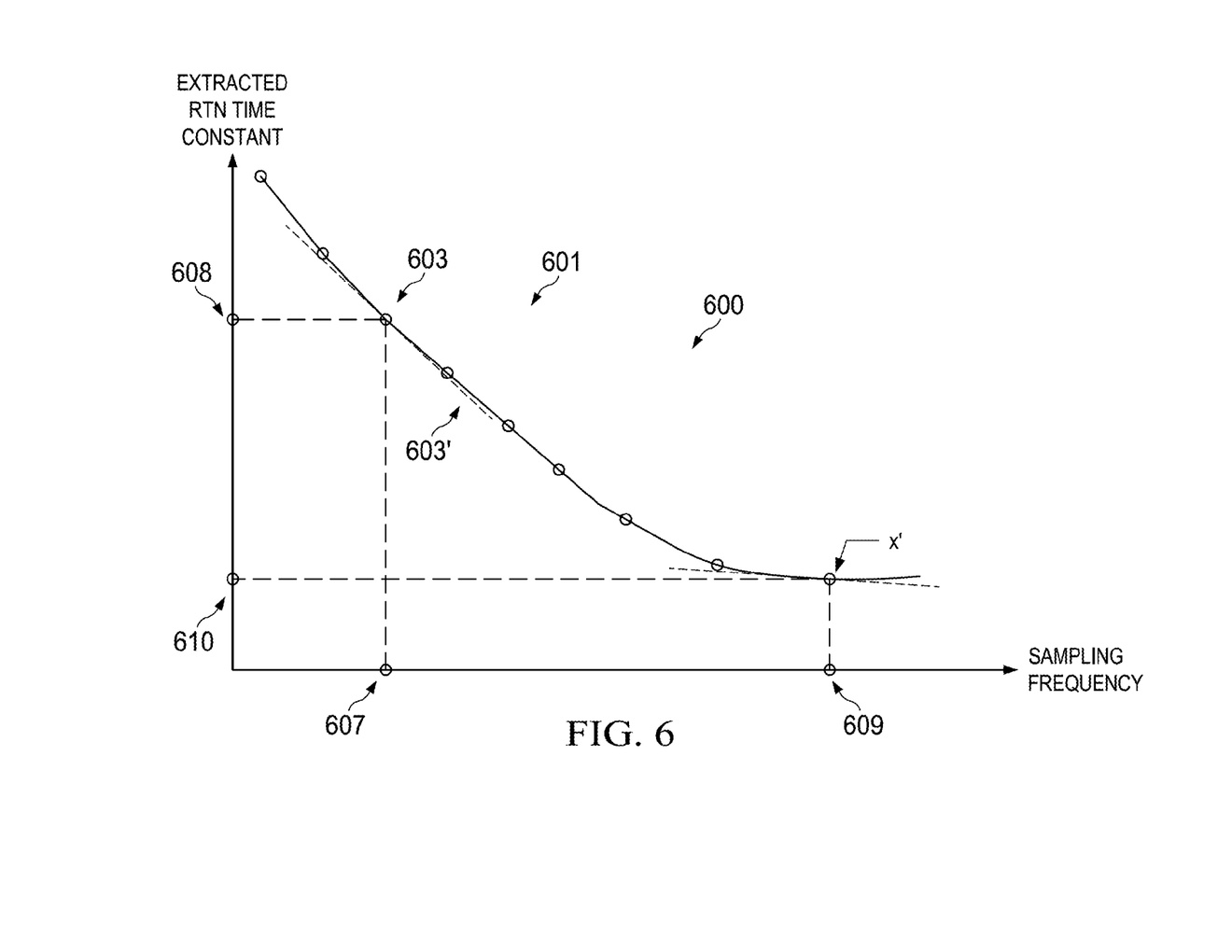
FIG. 6 shows a graph to further illustrate the flow diagram to determine a final value of a random telegraph noise (RTN) constant in accordance with various embodiments.

FIG. 6 shows the graph 600 representing the relationship between the extracted RTN time constants and sampling frequency. As shown in graph 600, the x-axis of the graph 600 is referred to as the sampling frequency, and the y-axis of the graph 600 is referred to as the extracted RTN time constant. More specifically, the graph 600 includes a curve 601 which indicates the relationship between the extracted RTN time constants and sampling frequency for one bias level. The curve 601 includes nine data points (e.g., 603), each of the data points includes a value of an extracted RTN time constant (e.g., 608) at an associated sampling frequency (e.g., 607). In a preferred embodiment, the computing resource 202 determines the final value for the RTN time constant by computing a derivative value (e.g., 603' and X') at each data point of the curve 601. Further, the computing resource 202 executes the final value time constant determination module 309 to compare the computed derivative values to a predetermined suitable threshold. If the derivative value at a particular data point is less than the threshold, the computing resource 202 may determine that the extracted RTN time constant associated with the particular data point is the final value of the RTN time constant. For example, since the derivative value 603' is greater than the threshold, the computing resource 202 may disregard the data point 603 as the data point to extract the final value of the RTN time constant. In contrast, after computing the derivative value X', the computing resource 202 acknowledges that X' is not greater than the threshold. As such, the computing resource 202 may use extracted RTN time constant value 610 as the final RTN time constant value for one of the levels.

Referring back to the flow diagram 500, after the computing resource 202 determines the final values for the RTN time constants, the flow diagram 500 continues with block 512 to select a sampling frequency to determine the RTN magnitude. By executing the second integration time determination module 311, the computing resource 202 chooses a second integration time, based on the final RTN time constant values for each stable states, wherein the second integration time is not greater than a minimum value between the final RTN time constant values. Further, the computing resource 202 selects the sampling frequency, wherein the sampling frequency is not greater than an inverse value of the second integration time.

After the sampling frequency is selected at block 512, the computing resource 202 executes the magnitude determination module 313 to cause the analyzer 204 to measure a signal using the selected sampling frequency. Based on the measured signal, the computing resource 202 may execute the stable state identification module 303 again to compute a change (e.g., 120) in the parameter between any of the two levels (e.g., 140 and 150), that is, the RTN magnitude. Upon the change in the parameter has been computed, in a preferred embodiment, the computing resource 202 may store the determined final values of the RTN time constants and the calculated RTN magnitude in a storage device for further applications. Further, the computing device 202 may execute the signal generation module 301 again to apply an additional condition (e.g., voltage or temperature) on the device 206. Thus, the flow diagram 500 starts from the block 502 and ends at the block 514 to generate an additional set of values including the final values of the RTN time constants and the RTN magnitude at the additional condition. The additional set of values is also stored in the storage device for further application.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method, comprising:
for a device and at each of a plurality of sampling frequencies, measuring a parameter of the device to generate a plurality of signals, each signal representing a time series of values of the parameter;
for each of the plurality of signals, identifying at least two stable states in the time series for each signal;
determining a time constant associated with each stable state of each signal;
determining a relationship between the time constants of each stable state and sampling frequency; and
computing a final time constant value for each steady state by computing a derivative of the time constants as a function of sampling frequency relationship and comparing the derivative to a threshold.

2. The method of claim 1 wherein computing a final time constant value for each steady state includes identifying a steady state value associated with the sampling frequency at which the derivative falls below the threshold.

3. The method of claim 1 further comprising measuring each of the signals under a plurality of sampling frequencies at a single bias condition, and repeating the measuring at an additional bias condition.

4. The method of claim 1 further comprising measuring the signals under a plurality of sampling frequencies by using a first integration time, wherein the first integration time is not greater than an inverse value of each of the sampling frequencies.

5. The method of claim 4 further comprising:
based on the final time constant values for each stable states, choosing a second integration time, wherein the second integration time is not greater than a minimum value between the final time constant values;
determining a sampling frequency, wherein the sampling frequency is not greater than an inverse value of the second integration time; and
measuring a change of values of the parameter between each of the stable states by using the second sampling frequency.

6. The method of claim 1 wherein the parameter of the device is at least one of: current, voltage, threshold voltage, resistance, and magnetization.

7. A method, comprising:
measuring a drain current of a semiconductor device over time, at a condition, by using one of a plurality of sampling frequencies and a first integration time, to generate a plurality of signals, each signals representing a time series of the drain current;
identifying a first time constant and a second time constant from the each of the plurality of measured signals, wherein the first time constant and the second time constant are associated with a first stable state and a second stable state for each of the plurality of measured signal respectively;
determining a relationship between the first and second time constants, and sampling frequencies; and
determining a final value for each of the time constants by computing a derivative of the time constants as a function of sampling frequency relationship and comparing the derivative to a threshold.

8. The method of claim 7 wherein the determining the final value comprises identifying a time constant value associated with the sampling frequency at which the derivative falls below the threshold.

9. The method of claim 7 wherein the first time constant is emission time constant and the second time constant is capture time constant, and each of the time constants is associated with a defect in the semiconductor device.

10. The method of claim 7 further comprising measuring the drain current of the semiconductor device over time at an additional bias condition.

11. The method of claim 7 further comprising:
choosing a second integration time to measure a change in the drain current, wherein the second integration time is not greater than a minimum value between the final values for the first and second time constants;
determining a sampling frequency, wherein the sampling frequency is not greater than an inverse value of the second integration time; and
measuring, under the bias condition, the change in the drain current of the semiconductor device by using the determined sampling frequency.

12. The method of claim 11 wherein the change in the drain current is a difference between the first and the second stable states.

13. The method of claim 7 wherein the semiconductor device is a metal oxide semiconductor (MOS) device.

14. The method of claim 7 wherein the condition includes a voltage bias and temperature.

15. A system, comprising:
an analyzer to measure a parameter of a device to generate a plurality of signals, each signal representing a time series of values of the parameter; and
a computing resource coupled to the analyzer, comprising:
a processor configured to execute a plurality of modules to;
for the device at each of a plurality of sampling frequencies, cause the analyzer to apply a condition on the device to be measured and generate a plurality of signals over time using a first integration time, each signals representing a time series of values of the parameter;
identify at least two stable states in the time series for each signal;
determine a time constant associated with each stable state of each signal;
determine a relationship between the time constants of each stable state and sampling frequency; and
compute a final time constant value for each steady state by computing a derivative of the time constants as a function of sampling frequency relationship and comparing the derivative to a threshold.

16. The system of claim 15 wherein the computing resource to compute a final time constant value for each steady states comprises to identify a steady state value associated with the sampling frequency at which the derivative falls below the threshold.

17. The system of claim 15 further comprising the computing resource causes the analyzer to apply an additional condition so as to repeatedly generate a plurality of signals over time, wherein the condition includes voltage bias and temperature.

18. The system of claim 15 further comprising the processor configured to execute a plurality of modules to cause the analyzer to:
based on the final time constant value for each steady state, choose a second integration time, wherein the second integration time is not greater than a minimum value among the final time constant values for the steady states;
determine a sampling frequency, wherein the sampling frequency is frequency is not greater than an inverse value of the second integration time, and is greater than an inverse value of the first average time; and measure a change of values of the parameter between each of the stable states by using the second sampling frequency.

19. The system of claim 15 wherein the parameter of the device is at least one of: current, voltage, threshold voltage, resistance, and magnetization.

\* \* \* \* \*